(12) United States Patent  
Kupcsik et al.

(10) Patent No.: US 11,964,400 B2  
(45) Date of Patent: Apr. 23, 2024

(54) DEVICE AND METHOD FOR CONTROLLING A ROBOT TO PICK UP AN OBJECT IN VARIOUS POSITIONS

(71) Applicant: Robert Bosch GmbH, Stuttgart (DE)

(72) Inventors: Andras Gabor Kupcsik, Boeblingen (DE); Marco Todescato, Stuttgart (DE); Markus Spies, Karlsruhe (DE); Nicolai Waniek, Dornstadt (DE); Philipp Christian Schillinger, Renningen (DE); Mathias Buerger, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 323 days.

(21) Appl. No.: 17/453,920

(22) Filed: Nov. 8, 2021

(65) Prior Publication Data

US 2022/0152834 A1    May 19, 2022

(30) Foreign Application Priority Data

Nov. 13, 2020    (DE) .................... 10 2020 214 301.3

(51) Int. Cl.
*B25J 9/16* (2006.01)
*G06F 18/213* (2023.01)
(Continued)

(52) U.S. Cl.
CPC ............ *B25J 9/1697* (2013.01); *B25J 9/163* (2013.01); *B25J 9/1664* (2013.01);
(Continued)

(58) Field of Classification Search
None
See application file for complete search history.

(56) References Cited

U.S. PATENT DOCUMENTS 9,129,156 B2 * 9/2015 Herbschleb .......... G06V 20/582  
9,868,212 B1 * 1/2018 Hinterstoisser ........ B25J 9/1671  
(Continued)

FOREIGN PATENT DOCUMENTS

DE    102014106210 B4    12/2015  
DE    102017108727 A1    10/2018  
(Continued)

OTHER PUBLICATIONS

Semochkin, A. N., Seyedhassan Zabihifar, and A. R. Efimov. "Object grasping and manipulating according to user-defined method using key-points." 2019 12th International Conference on Developments in eSystems Engineering (DeSE). IEEE, 2019. (Year: 2019).*

(Continued)

*Primary Examiner* — Michelle M Entezari Hausmann  
(74) *Attorney, Agent, or Firm* — NORTON ROSE FULBRIGHT US LLP; Gerard A. Messina

(57) ABSTRACT

A method for controlling a robot to pick up an object in various positions. The method includes: defining a plurality of reference points on the object; mapping a first camera image of the object in a known position onto a first descriptor image; identifying the descriptors of the reference points from the first descriptor image; mapping a second camera image of the object in an unknown position onto a second descriptor image; searching the identified descriptors of the reference points in the second descriptor image; ascertaining the positions of the reference points in the three-dimensional space in the unknown position from the found positions; and ascertaining a pickup pose of the object for the unknown position from the ascertained positions of the reference points.

10 Claims, 6 Drawing Sheets

(51) Int. Cl.
*G06F 18/214* (2023.01)
*G06F 30/10* (2020.01)
*G06T 7/50* (2017.01)
*G06T 7/70* (2017.01)
*G06V 20/10* (2022.01)

(52) U.S. Cl.
CPC .......... *G06F 18/213* (2023.01); *G06F 18/214* (2023.01); *G06F 30/10* (2020.01); *G06T 7/50* (2017.01); *G06T 7/70* (2017.01); *G06V 20/10* (2022.01); *G06T 2207/20081* (2013.01)

(56) References Cited

U.S. PATENT DOCUMENTS

| | | | |
|---|---|---|---|
| 10,766,149 B2 | 9/2020 | Marchese et al. | |
| 2011/0273442 A1* | 11/2011 | Drost | G06V 10/757 345/419 |
| 2012/0114175 A1* | 5/2012 | Hwang | G06V 20/647 382/103 |
| 2015/0010202 A1* | 1/2015 | Tuzel | G06T 7/75 382/103 |
| 2015/0224650 A1* | 8/2015 | Xu | B25J 9/1692 414/730 |
| 2018/0101932 A1* | 4/2018 | Kwon | G06T 7/50 |
| 2018/0307241 A1* | 10/2018 | Holz | G05D 1/0274 |
| 2018/0336464 A1* | 11/2018 | Karras | G06V 10/454 |
| 2019/0184570 A1* | 6/2019 | Yung | B25J 9/163 |
| 2020/0311855 A1* | 10/2020 | Tremblay | G06T 1/0014 |
| 2021/0080264 A1* | 3/2021 | Sugiura | G06V 20/56 |
| 2021/0122045 A1* | 4/2021 | Handa | G06T 7/74 |
| 2021/0134007 A1* | 5/2021 | Ahmed | G06V 20/00 |
| 2021/0369077 A1* | 12/2021 | Schrempp | B25J 15/12 |
| 2022/0044439 A1* | 2/2022 | Hou | G06T 7/75 |

FOREIGN PATENT DOCUMENTS

| | | |
|---|---|---|
| DE | 102018111407 A1 | 11/2018 |
| DE | 102018113672 A1 | 12/2018 |
| DE | 112017002156 T5 | 1/2019 |
| DE | 212018000178 U1 | 10/2019 |
| DE | 102019122790 A1 | 2/2020 |
| DE | 102019206444 A1 | 11/2020 |
| EP | 3702108 A1 | 9/2020 |

OTHER PUBLICATIONS

Johns, Edward, Stefan Leutenegger, and Andrew J. Davison. "Deep learning a grasp function for grasping under gripper pose uncertainty." 2016 IEEE/RSJ International Conference on Intelligent Robots and Systems (IROS). IEEE, 2016. (Year: 2016).*

Paul, Shuvo Kumar, et al. "Object detection and pose estimation from rgb and depth data for real-time, adaptive robotic grasping." Advances in Computer Vision and Computational Biology: Proceedings from IPCV'20, HIMS'20, BIOCOMP'20, and BIOENG'20. Cham: Springer International Publishing, 2021. 121-142 (Year: 2021).*

* cited by examiner

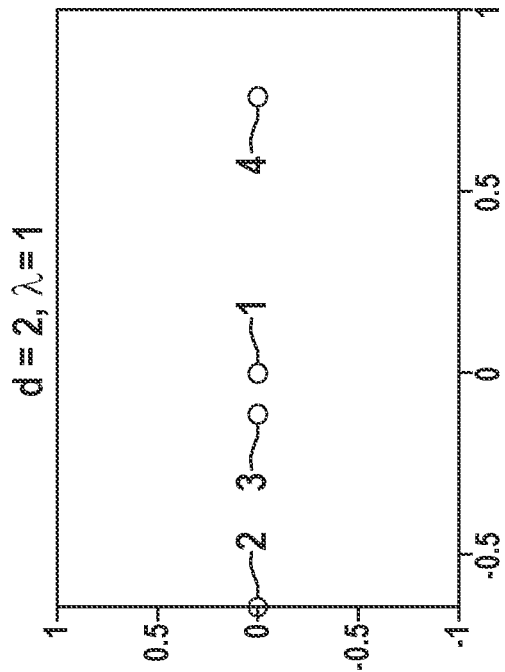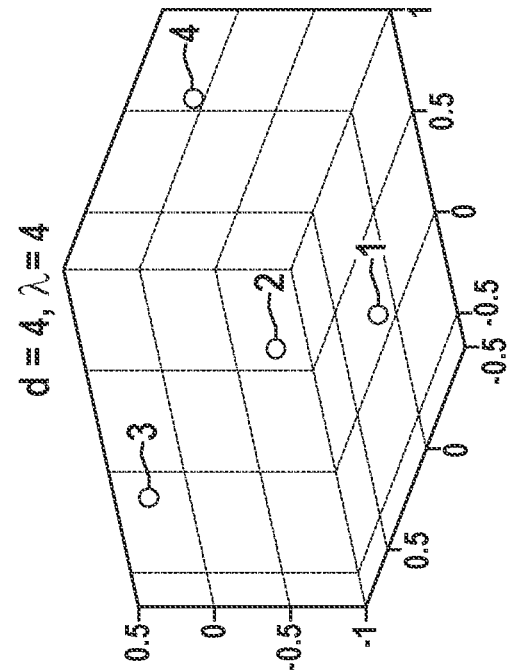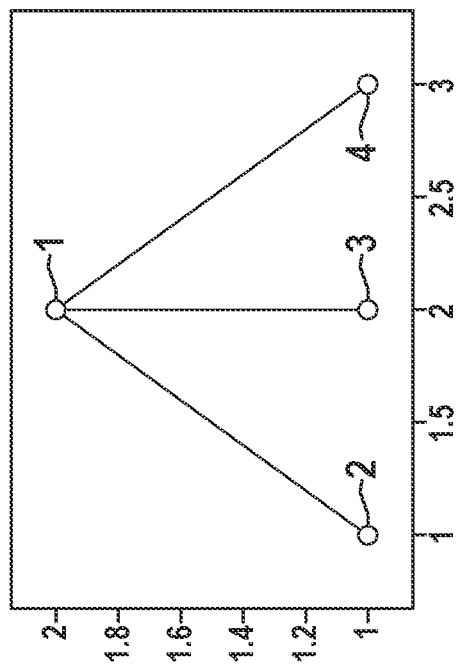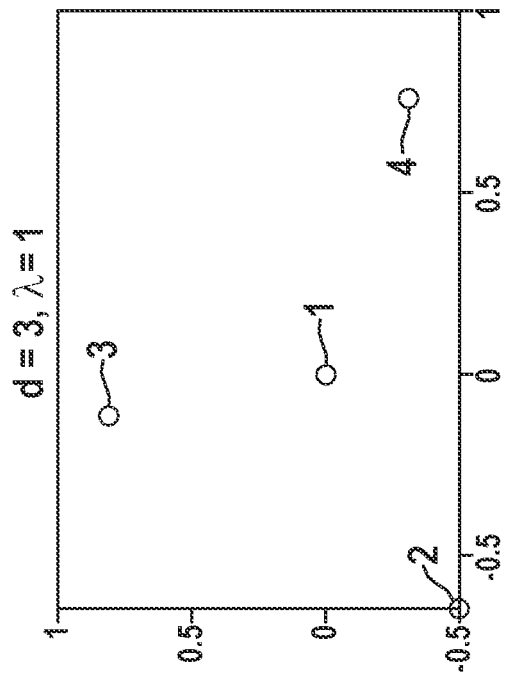
Fig. 3

DEVICE AND METHOD FOR CONTROLLING A ROBOT TO PICK UP AN OBJECT IN VARIOUS POSITIONS

CROSS REFERENCE

The present application claims the benefit under 35 U.S.C. § 119 of German Patent Application No. DE 102020214301.3 filed on Nov. 13, 2020, which is expressly incorporated herein by reference in its entirety.

FIELD

The present disclosure relates to devices and methods for controlling a robot to pick up an object in various positions.

BACKGROUND INFORMATION

In order to enable a flexible production or processing of objects by a robot, it is desirable for the robot to be able to handle an object regardless of the position in which the object is placed in the working space of the robot. Therefore, the robot should be capable of recognizing in what position the object is situated, at least insofar as this is relevant for picking up (e.g., grasping) the object; i.e., the robot should be capable of ascertaining a pickup pose (e.g., a grasping pose) of the object in order to correspondingly be able to correctly orient its end effector (e.g., having a gripper), and to be able to move it to the correct position. Corresponding control methods for a robot device for picking up an object in various positions are desirable.

SUMMARY

According to various specific embodiments of the present invention, a method is provided for controlling a robot to pick up an object in various positions, the method including: defining a plurality of reference points on the object, so that the position of the reference points in the three-dimensional space define a pickup pose of the object; receiving a first camera image of the object in a known position of the object, so that the positions of the reference points in the first camera image are known; mapping the first camera image onto a first descriptor image using a machine learning model that is trained to assign object points visible in camera images to descriptors, independent of their position in the camera images; identifying the descriptors of the reference points from the first descriptor image by reading out the first descriptor image at the known positions of the reference points; receiving a second camera image of the object in an unknown position in which the object is to be picked up; mapping the second camera image onto a second descriptor image using the machine learning model; searching for the identified descriptors of the reference points in the second descriptor image; ascertaining the positions of the reference points in the three-dimensional space in the unknown position from the found positions of the descriptors of the reference points in the descriptor image; ascertaining a pickup pose of the object for the unknown position from the ascertained positions of the reference points in the three-dimensional space; and controlling the robot device to pick up the object corresponding to the ascertained pickup pose.

The method described above enables the secure picking up (e.g., grasping) of an object for any position of the object. One camera image of the object in an unknown position is sufficient to ascertain a pickup pose of the object. In particular, an array of a plurality of cameras that cover a plurality of perspectives is not required. The machine learning model can be flexibly trained, so that it can be used for various objects. It is then necessary only to define reference points for each object, and to ascertain the descriptors of the reference points.

In the following, various examples are indicated.

Example 1 is the method for controlling a robot for picking up an object in various positions as described above.

Example 2 is the method of example 1, the positions of the reference points in the three-dimensional space in the unknown position being ascertained from the found positions of the descriptors of the reference points in the second descriptor image by projecting depth information for the positions of the reference points in the second camera image, corresponding to the positions of the reference points in the second descriptor image, into the three-dimensional space.

In this way, the ascertaining of the pickup pose is possible using a single camera image and associated depth information (e.g., of an RGBD image).

Example 3 is the method of Example 1 or 2, the reference points including at least two reference points that are defined in such a way that they are situated along an extended segment of the object, and the pickup pose of the object being ascertained for the unknown position by ascertaining an axis that extends through the reference points.

In this way, a pickup pose can be ascertained that enables the controlling of the robot to grasp the extended segment. For example, a gripper on the end effector of the robot is controlled so that the gripping tongs are situated in a plane perpendicular to the axis that extends through the reference points, and then the gripper is closed.

Example 4 is the method of one of Examples 1 through 3, the reference points including at least three reference points that are defined in such a way that they are situated on a flat surface of the object, and the pickup pose of the object for the unknown position being ascertained by ascertaining a plane that extends through the reference points.

In this way, a pickup pose can be ascertained that enables the controlling of the robot to take hold of the surface (e.g. by suction or lifting). For example, a suction device on the end effector of the robot is controlled so that the suction opening, or the suction nozzle, of the suction device is situated perpendicular to the plane that extends through the reference points, and is then activated.

Example 5 is the method of one of Examples 1 through 4, the training of the machine learning model including: obtaining a 3D model of the object, the 3D model including a grid of vertices; determining a descriptor for each vertex of the grid; producing training data image pairs, each training data image pair including a training input image that indicates the object and a target image, and the production of the target image including determination of the vertex positions of vertices of the object model of the object that the vertices have in the training input image; and assigning, for each determined vertex position in the training input image, the descriptor determined for the vertex at the vertex position to the position in the target image, and training of the machine learning model through supervised learning using the training data image pairs as training data.

This training method enables the training of a machine learning model (such as a neural network) in order to carry out a more precise prediction (i.e. descriptor determination) compared to the use of self-supervised learning (i.e., it enables a larger variety of applications of the network). In addition, it provides greater flexibility for the adaptation of the machine learning model, so that it can be applied to various problems and reduces the training data requirements (e.g. the amount of required training data).

Example 6 is the method of Example 5, the production of the training data image pairs including obtaining a plurality of images of the object with various positions and producing a training data image pair of each obtained image by producing a target image for the obtained image.

This enables the training of the machine learning model (e.g. of a robot having a robot control system that implements the machine learning model) in order to recognize the topology of an object regardless of the position of the object, e.g. in the working space of the robot.

Example 7 is the method of Example 5 or 6, including determination of the vertex positions of vertices of the object model of the object that the vertices have in the training input images from the respective positions that the object has in the training input images (e.g. in the camera coordinate system).

This enables a precise determination of the vertex positions, which in turn enables precise target images for supervised training.

Example 8 is the method of one of Examples 5 through 7, the vertices of the 3D model being connected by edges, each edge having a weight that specifies the closeness of two vertices in the object connected by the edge, and the determination of a descriptor for each vertex of the grid taking place by searching descriptors for the vertices that minimize the sum, over pairs of connected vertices, of distances between the descriptors of the pair of descriptors, weighted by the weight of the edge between the pair of vertices.

As can be seen, the descriptors are ascertained in an optimal manner. In this way, a high consistency of the descriptors is achieved. Moreover, a good explicability of the descriptor mapping is achieved.

Example 9 is a robot control device that is set up to carry out a method according to one of Examples 1 through 8.

Example 10 is a computer program that has instructions that, when executed by a processor, bring it about that the processor carries out a method according to one of Examples 1 through 8.

Example 11 is a computer-readable medium that stores instructions that, when executed by a processor, bring it about that the processor carries out a method according to one of Examples 1 through 8.

In the figures, in general similar reference characters refer to the same parts everywhere in the various views. The figures are not necessarily true to scale; instead, the emphasis is generally on the illustration of the features of the present invention. In the following description, various aspects of the present invention are described with reference to the figures.

BRIEF DESCRIPTION OF THE DRAWINGS

FIG. 3 shows an example of an embedding of a 4-node graph for descriptor determination, in accordance with the present invention.

DETAILED DESCRIPTION OF EXAMPLE EMBODIMENTS

The following detailed description refers to the figures, which illustrate specific details and aspects of the present disclosure with which the present invention can be realized. Other aspects can be used, and structural, logical, and electrical modifications can be made, without departing from the scope of protection of the present invention. The various aspects of this disclosure do not necessarily mutually exclude one another, because many aspects of this disclosure can be combined with one or more other aspects of this disclosure in order to form new aspects.

In the following, various examples are described in more detail.

Figure 1:
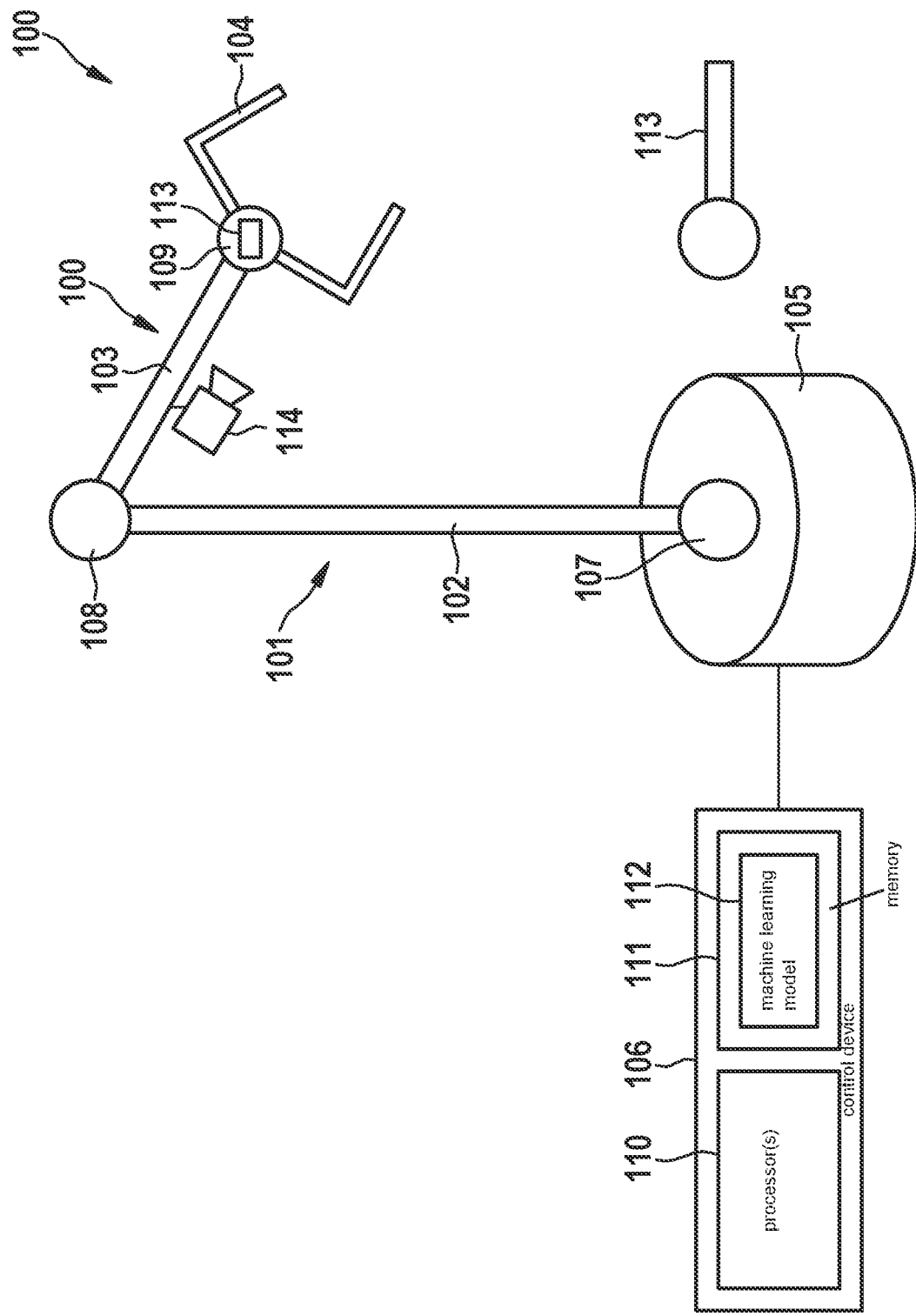
FIG. 1 shows a robot in accordance with an example embodiment of the present invention.

FIG. 1 shows a robot 100.

Robot 100 includes a robot arm 101, for example an industrial robot arm for handling or assembling a workpiece (or one or more other objects). Robot arm 101 includes manipulators 102, 103, 104 and a base (or support) 105 by which manipulators 102, 103, 104 are supported. The term "manipulator" relates to the movable components of robot arm 101, whose actuation enables a physical interaction with the environment, in order for example to carry out a task. For controlling, robot 100 includes a (robot) control device 106 that is designed to implement the interaction with the environment in accordance with a control program. The final component 104 (situated furthest from support 105) of manipulators 102, 103, 104 is also designated the end effector 104, and can include one or more tools, such as a welding torch, a grasping instrument, a painting device, or the like.

The other manipulators 102, 103 (which are situated closer to support 105) can form a positioning device, so that, together with end effector 104, robot arm 101 having end effector 104 is provided. Robot arm 101 is a mechanical arm that can provide functions similar to a human arm (possibly with a tool at its end).

Robot arm 101 can include joint elements 107, 108, 109 that connect manipulators 102, 103, 104 to one another and to support 105. Joint element 107, 108, 109 can have one or more joints that can each provide a rotational movement and/or translational movement (i.e. displacement) for associated manipulators relative to one another. The movement of manipulators 102, 103, 104 can be initiated by actuators that are controlled by control device 106.

The term "actuator" can be understood as referring to a component that is designed to bring about a mechanism or process as a reaction to its drive. The actuator can implement instructions (the so-called activation) created by control device 106 in mechanical movements. The actuator, e.g. an electromechanical transducer, can be designed to convert electrical energy into mechanical energy as a reaction to its drive.

The term "control device" can be understood as referring to any type of logic-implementing entity that can for example include a circuit and/or a processor that is capable of executing software, firmware, or a combination thereof, stored in a storage medium, and that can issue instructions, e.g. to an actuator in the present example. The control device can be configured for example by program code (e.g. software) in order to control the drive of a system, a robot in the present example.

In the present example, control device 106 includes one or more processors 110 and a memory 111 that stores code and data based on which processor 110 controls robot arm 101. According to various specific embodiments, control device 106 controls robot arm 101 on the basis of a machine learning model 112 that is stored in memory 111.

According to various specific embodiments, machine learning model 112 is designed and trained to enable robot 100 to recognize a pickup pose of an object 113 that is placed for example in a working space of robot arm 101. This means that robot 100 recognizes how it can pick up object 113, i.e. how it has to orient its end effector 104, and to where it has to move the end effector in order to pick up (e.g. to grasp) object 113. The pickup pose is understood such that it contains information adequate for the picking up, i.e. information about the orientation and position 113 of the object that is sufficient to ascertain therefrom how object 113 can be grasped. The pickup pose does not necessarily have to contain the complete orientation information about object 113, because, in the case of an object 113 having a rotationally symmetrical part for grasping, it can for example be unimportant how the rotationally symmetrical part is rotated about its axis of rotation.

Robot 100 can be equipped for example with one or more cameras 114 that enable it to record images of its working space. Camera 114 is for example fastened on robot arm 101, so that the robot can take images of object 113 from various perspectives by moving robot arm 101 about.

According to various specific embodiments, control device 106 implements a machine learning model 112 for object recognition, whose output it uses to ascertain the pickup pose of object 113.

An example of such a machine learning model 112 for object recognition is a dense object net. A dense object net maps an image (e.g. an RGB image provided by camera 114) onto a descriptor space image having any dimensionality (dimension D).

The dense object net is a neural network that is trained, using self-supervising learning, to output a descriptor space image for an input image of an image. The effectiveness of this approach is, however, strongly dependent on the quality of the collected training data and of the sensors used (e.g. cameras 114). In addition, the interpretation of the network prediction can be difficult.

According to various specific embodiments, an approach is used for recognizing an object and its position under the assumption that a 3D model (e.g. a CAD (computer-aided design) model) of the object is known, which is typically the case for industrial assembly or processing tasks. According to various specific embodiments, non-linear dimensionality reduction techniques are used to calculate optimal target images for training input images for a neural network. Instead of thus using self-supervised training of a neural network, according to various specific embodiments a supervised training of a neural network is used. RGBD (RGB+ depth information) images of an object may also be taken, and from these a 3D model for the object may be determined.

According to a specific embodiment, in order to produce training data for training machine learning model 112, first a data collection is carried out. In particular, registered RGB (red-green-blue) images are collected. Here, a registered image means an RGB image having known intrinsic and extrinsic camera values. In a real-world scenario, a camera 114 fastened to a robot (e.g. a camera fastened to a robot wrist joint) is for example used to scan an object while the robot (e.g. robot arm 101) moves about. Other extrinsic estimation techniques, e.g. ChArUco markers, can be used; i.e. an object can be placed at various positions relative to a ChArUco board and images of the configuration (of the ChArUco board and the object) are taken. In a simulated scenario, photorealistically produced RGB images are used, using known object positions.

After collecting the RGB images, for supervised training of a neural network target images for the RGB images are rendered.

It is assumed that the position of each object in world coordinates in each collected RGB image is known. For a simulated scenario, this is uncomplicated, but for a scenario in the real world it requires manual calibration, e.g. placing the object at predefined positions. RGBD images can also be used to determine the position of an object.

With this information, and using a vertex descriptor calculation technique as for example described in the following, for each RGB image (i.e. training input image) a descriptor image (i.e. training output image, also called target image or ground truth image) is rendered.

Figure 2:
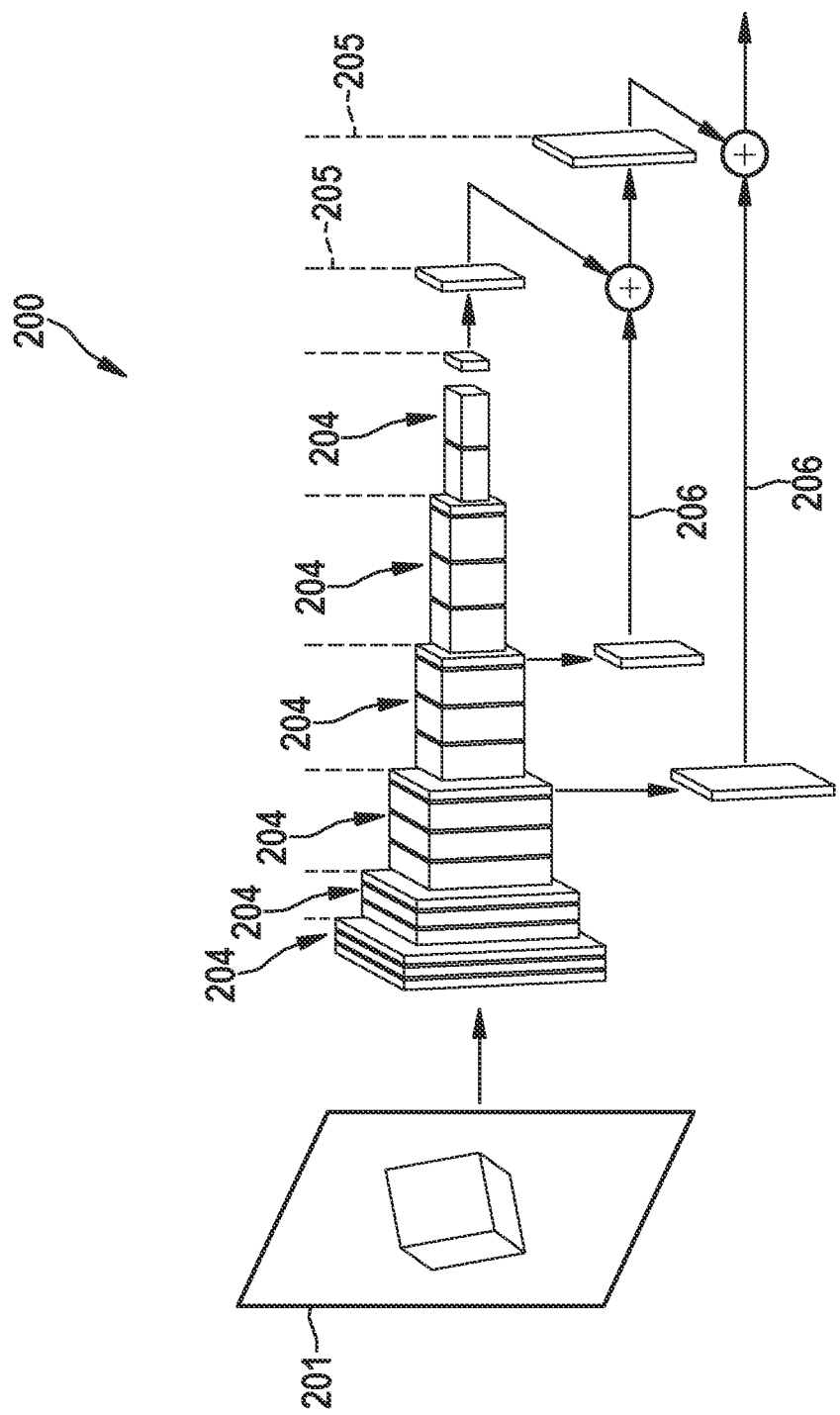
FIG. 2 illustrates the training of a neural network according to a specific embodiment of the present invention.

If for each RGB image a target image has been produced, i.e. pairs of RGB images and target images have been formed, these pairs of training input image and associated target image can be used as training data for training a neural network, as illustrated in FIG. 2.

FIG. 2 illustrates the training of a neural network 200 according to a specific embodiment.

Neural network 200 is a fully convolutional network that maps an h×w×3-tensor (input image) onto an h×w×D-tensor (output image).

It includes a plurality of levels 204 of convolution layers, followed by a pooling layer, upsampling layers 205, and skip connections 206 in order to combine the outputs of different layers.

For the training, neural network 200 receives a training input image 201 and outputs an output image 202 having pixel values in the descriptor space (e.g. color components according to descriptor vector components). A training loss between output image 202 and target image 203 associated with the training input image is calculated. This can be done for a stack of training input images, and the training loss can be averaged over the training input images, and the weights of neural network 200 are trained using stochastic gradient descent, using the training loss. The training loss calculated between output image 202 and target image 203 is for example an L2 loss function (in order to minimize a pixel-by-pixel least square error between target image 203 and output image 202).

Training input image 201 shows an object, and the target image, as well as the output image, contain vectors in the descriptor space. The vectors in the descriptor space can be mapped onto colors, so that output image 202 (as well as target image 203) resemble a heat map of the object.

The vectors in the descriptor space (also called (dense) descriptors) are d-dimensional vectors (e.g., d is 1, 2, or 3), that are assigned to each pixel in the respective image (e.g. to each pixel of input image 201, under the assumption that input image 201 and output image 202 have the same dimension). The dense descriptors implicitly code the surface topology of the object shown in input image 201, in invariant fashion relative to its position or the camera position.

If a 3D model of the object is given, it is possible to analytically determine an optimal (in the Riemannian sense) and unambiguous descriptor vector for each vertex of the 3D model of the object. According to various specific embodiments, using these optimal descriptors (or estimations of these descriptors that are determined by an optimization), target images are produced for registered RGB images, which results in a fully supervised training of neural network 200. In addition, the descriptor space is explicable and optimal regardless of the selected descriptor dimension d.

In the following, the 3D models are regarded as Riemannian manifolds $\mathcal{M}$ embedded in $\mathbb{R}^3$, which results in the calculation of geodesics (shortest path between vertices) while the geometry is taken into account. An optimal surface topology can be explicitly coded by embedding the 3D model in a d-dimensional Euclidean descriptor space, so that geodesic distances between adjacent vertices are preserved as well as possible. This Euclidean space is regarded as the descriptor space, and a search for the optimal mapping $f: \mathcal{M} \to \mathbb{R}^d$ is carried out.

According to a specific embodiment, the Laplace operator calculation for grids and its eigenvalue decomposition are used to determine (or at least estimate) the optimal embedding of vertices in the descriptor space. Instead of thus separating geodesic calculation and mapping optimization, the descriptors are extracted in a single framework by calculating the Laplace operator of the 3D model.

According to the approach described in the following, the embedding of a 3D object model in the Euclidean space in the descriptor space is determined in order to preserve distances (e.g. geodesic distances) between vertices.

For dimensionality reduction via the Laplace operator, a set of points $\{x_i\}_{i=1}^N, x \in \mathbb{R}^D$ is intended to correspond to nodes in an undirected graph. $W_{ij} \geq 0$ is intended to designate the connection strength or the closeness between two nodes $x_i$ und $x_j$, e.g. $W_{ij} = \exp(-\|x_i - x_j\|_2)$.

The goal is to find a d-dimensional embedding $\{y_i\}_{i=1}^N$, $y \in \mathbb{R}^d$ (typically, d<D), so that, if $x_i$ and $x_j$ are close, their embedding should then also be close:

$$Y^* = \arg\min_Y \frac{1}{2} \sum_{j=1}^N \sum_{i=1}^N w_{ij} \|y_i - y_j\|_2, \quad (1)$$

where $Y = |y_1 \ldots y_N|_{d \times N}$.
The optimization problem (1) is equivalent to $$Y^* = \arg\min_Y Tr(YLY^T), \quad L = D - A, \quad (2)$$

where $L_{N \times N}$ is the positive semi-definite Laplace matrix. A is the adjacency matrix having elements $A_{ij} = A_{ji} = W_{ij}$ and $D_{ii} = \Sigma_j A_{ij}$. It is to be noted that the optimal solution $Y^*$ can have any scaling and tendency. In order to remove this randomness, the weighted second moment can be normalized with $Y^T D Y = I$, which forces a unit variance in different dimensions. The resulting optimization problem then becomes $$Y^* = \arg\min_Y Tr(YLY^T), \quad (3)$$
$$s.t. YDY^T = I$$

using limited optimization with Lagrange parameters $\lambda \in \mathbb{R}^d$ $$\mathscr{J}(Y, \lambda) = Tr(YLY^T) - Tr(\text{diag}(\lambda)(YDY^T - I)), \quad (4)$$

$$\frac{\partial \mathscr{J}(Y, \lambda)}{\partial Y} = 2LY^T - 2\text{diag}(\lambda)DY^T,$$

$$LY^T = \text{diag}(\lambda)DY^T,$$

which is a generalized eigenvalue problem that can be solved using standard linear algebra libraries. Because L und D are positive (semi-)definite matrices, the eigenvalues can be written as $\lambda_0 = 0 \leq \lambda_1 \leq \ldots \leq \lambda_{N-1}$.

In addition, the first eigenvector (first column of $Y^T$) is equal to 1 (vector having only ones), which is a trivial solution that maps each vertex to a point. In addition, any two eigenvectors are orthogonal to one another. The solution to the eigenvalue problem yields N eigenvalues and corresponding eigenvectors having dimensionality N. However, in practice only the first d eigenvectors, corresponding to the lowest eigenvalues (apart from the trivial solution), are used.

Thus, the i-th column of Y is the embedding of the node i in $\mathbb{R}^d$, while each line represents the embedding of each point in different orthogonal dimensions.

FIG. 3 shows an exemplary embedding of a 4-node graph.

The eigenvalues have an important significance with regard to the optimality of the embedding. In the case of an optimal embedding $Y^*$, the constraint $Y^*DY^{*T} = I$ is fulfilled, and accordingly $$Y^*LY^{*T} = \text{diag}(\lambda). \quad (5)$$

that is, the eigenvalues correspond to the embedding errors in different dimensions. For simplicity, we set d=1, in which case each x is mapped to point y=1. In this case, (5) is simplified to:

$$\hat{y}^T L \hat{y} = \lambda_0, \hat{y} = [y_1, \ldots, y_N]^T = 1^T. \quad (6)$$

Here $\lambda_0 = 0$, i.e. if all vertices of the object are mapped to one point, the embedding error is 0, because the distance between all points y is 0. For practical purposes, this is not useful, and thus the first eigenvalue and eigenvector are omitted. The use of d=2 corresponds to the mapping of each point x onto a line, and $\lambda 1$ is the corresponding embedding error, and so on. Because the eigenvectors are orthogonal to one another, increasing d will add new dimensions to the embedding, with the goal of minimizing the errors in the new, orthogonal dimension. The same effect can be seen in (3): because $Tr(YLY^T) = \Sigma_{i=1}^d \lambda_i$, the original objective can be carried over in order to minimize the embedding errors in each dimension. Regardless of the selected d, the resulting descriptor vector is thus optimal.

In many cases, subsequent eigenvalues are identical, i.e. $\lambda_i = \lambda_{i+1} = \lambda_{i+2} = \ldots$ (see the example of FIG. 3, in which the eigenvalues for d=2 and d=3 are the same). This carries some information regarding symmetry, there being a plurality of orthogonal dimensions having identical embedding errors. In fact, in the 4-node graph example of FIG. 3, if the graph is fully connected the embedding in each dimension is symmetrical and all eigenvalues are identical, with the exception of the trivial solution.

The above graph embedding approach can be applied directly in grids, point clouds, etc. For example, the K-Nearest-Neighbor (KNN) algorithm can be used to form local connections between vertices and to create the adjacency matrix. This approach is sufficient to create the graph Laplace operator and to calculate the embedding of each vertex. Nonetheless, this approach is inherently based on a Euclidean distance metric and heuristics that do not necessarily take into account the underlying Riemannian geometry of the 3D object model. For example, many edges may run through the object, or may connect non-adjacent vertices of the grid. Even only a few incorrect entries in the adjacency matrix can result in poor embedding performance. According to a specific embodiment, if models are used, it is thus ensured that geodesic distances between any two vertices are correct or have a minimum approximation error.

In general, object models such as grids or point clouds can be represented as Riemannian manifolds embedded in $\mathbb{R}^3$. A Riemannian manifold M having a uniformly changing metric g can be regarded as "locally Euclidean," which captures the property of local smoothness of objects in the real world. The generalization of the Laplace operator to Riemannian manifolds is the Laplace-Beltrami (LB) operator $\Delta$. Similar to the Laplace operator in Euclidean spaces, the LB operator applied to a function is the divergence of the gradients of the function. While the Laplace operator for graphs and in Euclidean spaces is easy to calculate (either from adjacency information or from finite differences), in differential geometry the LB operator is based on exterior calculus, and in general is not easily obtainable for a manifold.

For conventional discrete manifolds, such as grids, the LB operator can however be approximated. This offers a highly efficient and simple calculation framework if grids, point clouds, etc. are used. Because the Riemannian equivalent of the Laplace operator is the Laplace-Beltrami, the above-described embedding approach can be applied directly with $\Delta$. The eigenvectors Y of $\Delta$ will represent the optimal d-dimensional Euclidean embedding of the vertices of the grid.

A can be efficiently calculated for grids as follows. Assume a grid having N vertices V, surfaces F, and edges E. In this case, the size of $\Delta$ is N×N. The i-th line of $\Delta$ describes the adjacency information of the i-th vertex of its vertices to be connected. Let $\varphi$ be an arbitrary function on the grid. Then the application of the discrete LB operator, with this function, is mapped onto $\Delta\varphi$. The i-th element of this function can be described by the following:

$$(\Delta\phi)_i = \frac{1}{2}\sum_{ij\in P}\left(\cot(\theta_k^{ij}) + \cot(\theta_l^{ji})\right)(\phi_j - \varphi_i), \quad (7)$$

Figure 4:
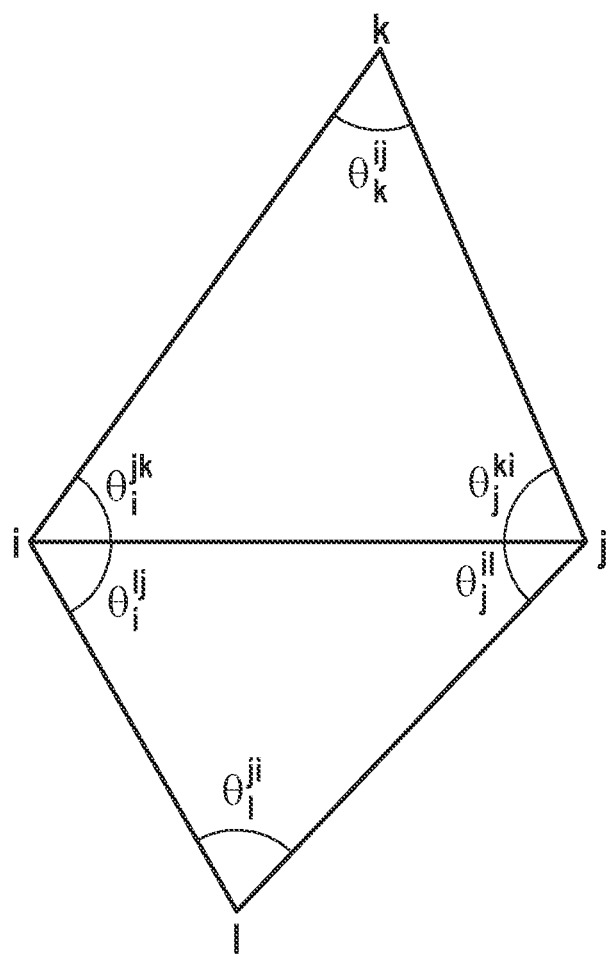
FIG. 4 illustrates the definition of angles at vertices of a 3D model for edge weight determination according to the Laplace-Beltrami operator, in accordance with an example embodiment of the present invention.

FIG. 4 illustrates the definition of angles $\theta_k^{ij}$ und $\theta_l^{ji}$.

The sum of the cotangent expressions $\cot(\theta_k^{ij})+\cot(\theta_l^{ji})$ acts as the connection weight $w_{ij}$. These weights occurring in (7), i.e. the weights of the LB operator, when applied in the grid, are used, according to a specific embodiment, as the weights for determining D and A of equation (2).

It should be noted that, because $\alpha>\pi/2 \Rightarrow \cot(\alpha)<0$, negative connection weights $w_{ij}$ can occur, especially when an angle is significantly larger than the other ones (non-good surfaces). In order to overcome this problem, the connection weight can be approximated by edge flipping.

The above-described approach to producing descriptors treats each vertex unambiguously. That is, each vertex is assigned to an unambiguous descriptor. However, objects can be symmetrical, and thus the assignment of unambiguous descriptors to apparently identical vertices will result in asymmetrical embeddings.

In order to address this problem, according to various specific embodiments intrinsic symmetries of shapes are detected and symmetrical embeddings are compressed, so that symmetrical vertices are mapped onto the same descriptor. It can be shown that a shape has intrinsic symmetry if the eigenfunctions of the Laplace-Beltrami operator appear symmetrical in Euclidean space. In other words, symmetrical features of a grid, a point cloud, etc., are detected if their geodesic-preserving Euclidean embedding (descriptor space) exhibits Euclidean symmetry. A compact manifold has intrinsic symmetry if a homeomorphism T exists that preserves geodesic distances between each vertex of the manifold.

For the compression of the symmetrical descriptors, so-called global intrinsic symmetry-invariant functions (GISIFs) can be used. Under the assumption of a global intrinsic symmetrical homeomorphism $T: \mathcal{M} \rightarrow \mathcal{M}$, s.t. g(p, q)=g(T(p), T(q)) $\forall p, q \in \mathcal{M}$, where g represents geodesic distance, and of a function on the manifold f, if for each point p on the manifold the following holds:

$$f \circ T(p)=f(T(p))=f(p), \quad (8)$$

then f is a GISIF. For example, on a torus, let this homeomorphism be an arbitrary rotation about the z axis. This means that if f is a GISIF, then it has to be invariant with respect to this rotation.

In addition, it can be shown that in the case of identical eigenvalues $\lambda_i=\lambda_{i+1}=\ldots=\lambda_{i+N}$, such a GISIF is the squared sum of the eigenvector components of the point, i.e.

$$f(p)=\Sigma_i^{i+N}\phi_i(p)^2.$$

This agrees with the above analysis of identical eigenvalues, which is the necessary condition of symmetrical embedding. Because in practice, due to numerical limitations, identical eigenvalues seldom occur, there a heuristic can be used where eigenvalues are regarded as identical if they lie within the same $\varepsilon$-sphere (for small $\varepsilon$), i.e. when they differ by less than a specified threshold, e.g. 0.1% or 0.01%. Because symmetrical dimensions only have to be found once for a given object, this can be carried out manually.

For example, let the first 7 eigenvalues of an eigenvalue decomposition for a torus be the following:

$$\lambda_{0-6}=[0.0, 0.0175, 0.0175, 0.069, 0.069, 0.1525, 0.1525]$$

A GISIF embedding in $\mathbb{R}^3$—disregarding the trivial solution—is then given by $$f(p)=[\phi_1(p)^2+\phi_2(p)^2, \phi_3(p)^2+\phi_4(p)^2, \phi_5(p)^2+\phi_6(p)^2].$$

In the case of a plurality of objects, this can be represented as a plurality of separate connected graphs. In this case, the adjacency matrix is block-diagonal. The symmetrical positive definite Laplace operator will again have orthogonal eigenvectors. There are two differences in the result of the eigenvalue decomposition compared to the case with individual graph embedding: first, the non-decreasing eigenvalues will be the embedding errors of all objects without ordering. Second, the eigenvectors will have null entries, because the corresponding eigenvalues remain orthogonal. This means that each dimension of the descriptor space will correspond to only one object embedding. In addition, the dimensions are ordered with reference to the embedding errors of the corresponding object. If in this way a three-dimensional embedding of two objects is to be produced, d=8 is used, because there are two trivial solutions corresponding to $\lambda=0$.

This uncomplicated approach handles a plurality of objects independently, whereas there can be suboptimal methods that nonetheless provide fairly good embeddings with lower d that make use of the correlation between objects.

Given the positions of objects, the target images can be produced by projecting the descriptors onto the image plane. As non-object (background), descriptor space image random noise, or an individual descriptor that is mapped onto the furthest removed point in the descriptor space, can be used.

In order to improve the robustness of the trained network 200, image augmentation methods, such as domain randomization, or interference such as Gaussian blur, cropping, or dropout, can be applied.

If machine learning model 112, e.g. neural network 200, is trained to map camera images of an object 113 onto descriptor images, then for the ascertaining of a pickup pose of an object 113 in an unknown position, the procedure can be as follows.

First, a plurality of reference points $p_i$, i=1, . . . , N on object 113 are selected and descriptors of these reference points are ascertained. This can take place in that a camera image of object 113 is recorded, reference pixels $(u_i, v_i)$ on the object (and thus corresponding reference points of the object) are selected, and the camera image is mapped by neural network 200 onto a descriptor image. The descriptors at the positions in the descriptor image, which are given by the positions of the reference pixels, can then be taken as descriptors of the reference points, i.e. the descriptors of the reference points are $d_i = I^d(u_i, v_i)$, where $I^d = f(I; \theta)$ is the descriptor image, where if is the mapping implemented by the neural network (of the camera image onto the descriptor image, I is the camera image, and $\theta$ is the weights of machine learning model 200.

If object 113 is in an unknown position, a camera image $I_{new}$ is then again taken, and, using the machine learning model, an associated descriptor image $I^d_{new} = f(I_{new}; \theta)$ is ascertained. In this new descriptor image, a search now takes place for descriptors that lie as close as possible to the $d_i$ descriptors of the reference images, for example using $$(u_i, v_i)^* = \mathrm{argmin}\ u_i, v_i \| I^d_{new}(u_i, v_i) - d_i \|_2^2 \text{ for all } i = 1, \ldots, N.$$

From the thus ascertained or estimated positions $(u_i, v_i)^*$ of the reference point in the descriptor image $I^d_{new}$ (and thus correspondingly in the new camera image $I_{new}$), the positions of the reference points in the three-dimensional space are ascertained. For example, together with the camera image $I_{new}$ a depth image is recorded (or the camera image $I_{new}$ has a depth channel, e.g. it is an RGBD image), so that from $(u_i, v_i)^*$ the three-dimensional position of the i-th reference point $p_i$ can be ascertained (by projecting the depth value at the position $(u_i, v_i)^*$ into the respective working area coordinate system).

Figure 5:
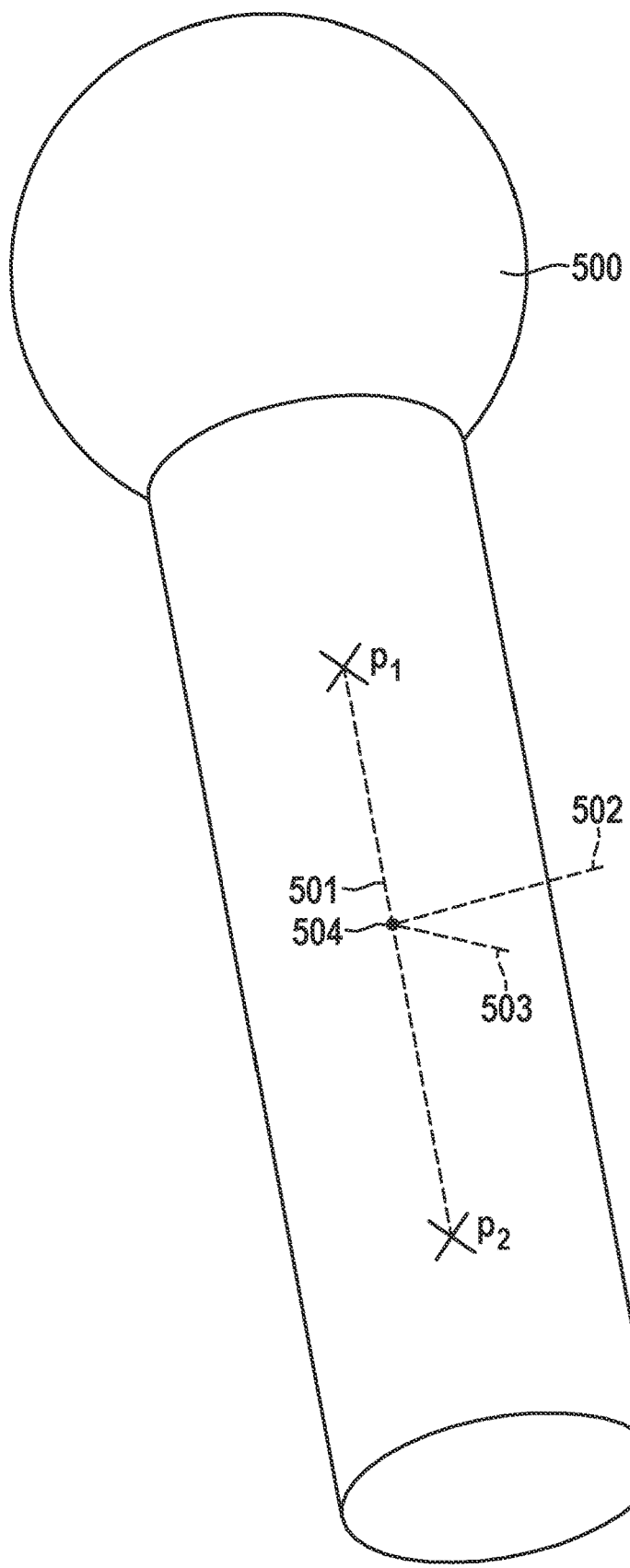
FIG. 5 shows a method for training a machine learning model for recognizing an object topology of an object from an image of the object according to a specific embodiment of the present invention.

If the positions of a plurality of reference points in the space are known, then a pickup pose can be ascertained therefrom, as is shown in FIG. 5.

For example, the position of two reference points $p_1$ and $p_2$ on object 500 in the space are ascertained and the two are combined in linear fashion, e.g. their mean value is taken, in order to define an anchor point 504. In order to define a grasping orientation, a first axis 501 having the direction $p_1$ and $p_2$ is defined, and a second axis 502 through the anchor point 504 is arbitrarily defined, e.g. in the z axis direction of camera 114 or in the direction of an axis of the working area coordinate system. A third axis 503 through anchor point 504 can be calculated through the vector product of the direction vector of first axis 501 and the direction vector of second axis 502. The three axes 501 to 503 and anchor point 504 define a pickup pose for object 500. A robot can then be controlled in such a way that it grasps the shaft of object 500, which extends in the direction of the first axis. The reference points $p_1$ and $p_2$ are for example defined in such a way that, as shown, they extend along the shaft, i.e. along an extended segment of the object suitable for grasping.

Analogously, three or more reference points can be situated on a grasping surface of an object, so that from their position a complete 6D pickup pose of the object, or also the orientation of a grasping surface, can be ascertained by which an object can be grasped.

Here it is to be noted that the gripper does not necessarily have to have the form of tongs, but also can be for example a suction device, in order to suction the object at a suitable surface and to pick it up in this way. In order to bring the suction device into the correct position, in this case it may for example be desirable to ascertain a pickup pose that indicates the orientation and position of a surface of the object that is suitable for the suctioning. This can be done for example by ascertaining an anchor point and a plane normal vector at the anchor point.

It is also possible to use more than three reference points to ascertain a pickup pose, e.g. in order to reduce errors through averaging.

Figure 6:
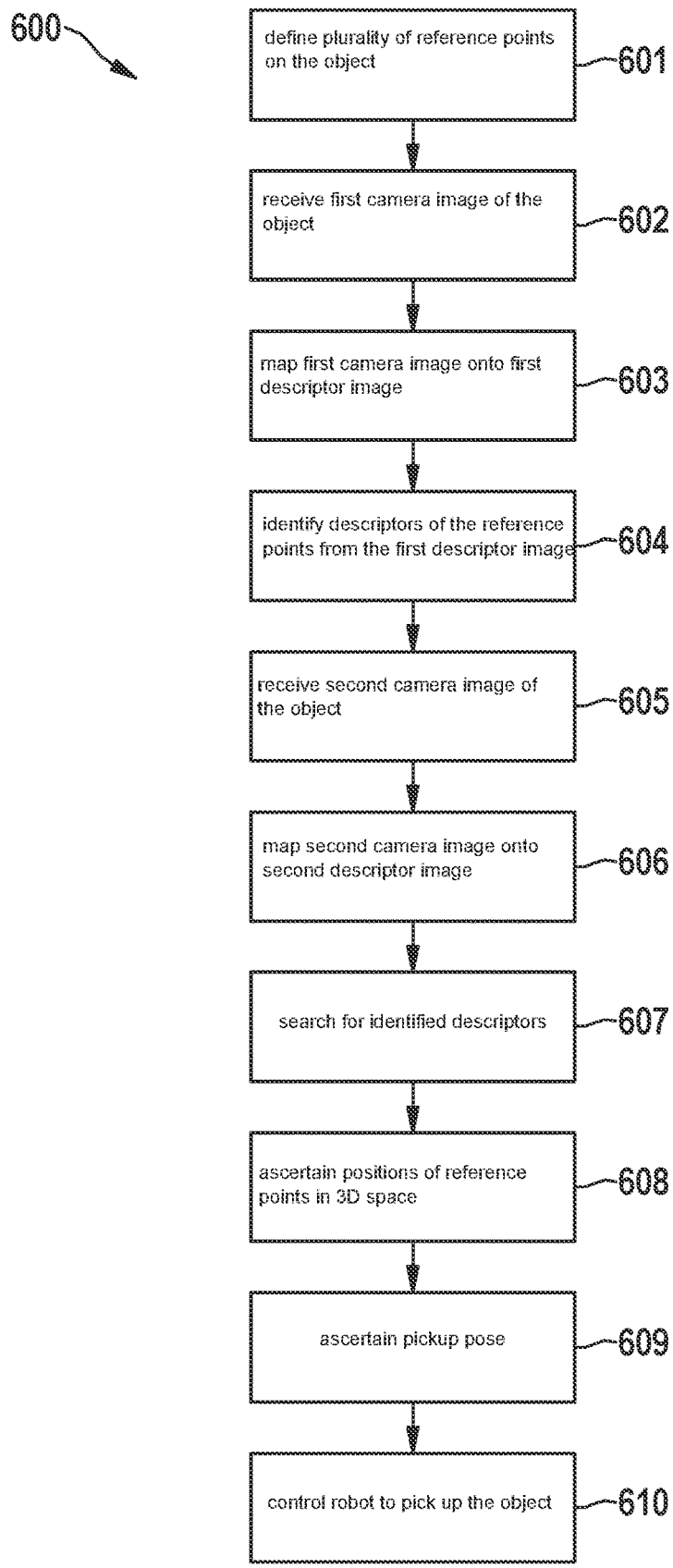
FIG. 6 shows a method for controlling a robot to pick up an object in various positions, in accordance with an example embodiment of the present invention.

Summarizing, according to various specific embodiments a method is provided as illustrated in FIG. 6.

FIG. 6 shows a method for controlling a robot to pick up an object in various positions.

In 601, a plurality of reference points on the object are defined, so that the position of the reference points in the three-dimensional space define a pickup pose of the object.

In 602, a first camera image of the object in a known position of the object is received, so that the positions of the reference points in the first camera image are known.

In 603, the first camera image is mapped onto a first descriptor image using a machine learning model that is trained to assign object points visible in camera images to descriptors, regardless of the position of the points in the camera images.

In 604, the descriptors of the reference points from the first descriptor image are identified by reading out the first descriptor image at the known positions of the reference points.

In 605, a second camera image is received of the object in an unknown position in which the object is to be picked up.

In 606, the second camera image is mapped onto a second descriptor image using the machine learning model.

In 607, a search is carried out for the identified descriptors of the reference points in the second descriptor image.

In 608, the positions of the reference points in the three-dimensional space in the unknown position are ascertained from the found positions of the descriptors of the reference points in the descriptor image.

In 609, a pickup pose of the object for the unknown position is ascertained from the ascertained positions of the reference points in the three-dimensional space.

In 610, the robot device is controlled to pick up the object corresponding to the ascertained pickup pose.

In other words, according to various specific embodiments the positions of a plurality of reference points are identified on the basis of their descriptors in a camera image that shows the object in an unknown position, and from their position in the camera image their position in the three-dimensional space is determined. From the position in the three-dimensional space of the plurality of reference points, a pickup pose (e.g. the orientation of one or more axes for grasping the object) is then determined.

"Picking up" is to be understood for example as grasping by a gripper. However, other types of holding mechanisms can also be used, e.g. a suction device for suctioning the object. Moreover, "picking up" is not necessarily to be understood as meaning only that the object is moved; for example it is also possible to take a component of a larger structure and bend it without separating it from the larger structure.

The machine learning model is for example a neural network. However, other machine learning models that are correspondingly trained may also be used.

According to various specific embodiments, the machine learning model assigns pixels of the object (in the image plane of the respective camera image) to descriptors. This can be regarded as indirect coding of the surface topology of the object. This connection between descriptors and the surface topology can be explicitly carried out by rendering in order to map the descriptors onto the image plane. It should be noted that descriptor values on surfaces (i.e. points that are not vertices) of the object model can be determined by interpolation. If, for example, a surface is given by 3 vertices of the object model with their respective descriptor values y1, y2, y3, then at any point of the surface the descriptor value y can be calculated as a weighted sum of these values $w_1 \cdot y_1 + w_2 \cdot y_2 + w_3 \cdot y_3$. In other words, the descriptor values are interpolated at the vertices.

In order to produce image pairs for training data for the machine learning model, for example an image of the object (e.g. an RGB image) including the object (or a plurality of objects), with a known 3D (e.g., CAD) model and known position (in a global (i.e. world) coordinate system) is mapped onto a (dense) descriptor image that is optimal in the sense that it is produced by a search for descriptors in order to minimize the deviation of geometrical properties (in particular the closeness of points of the object) between the object model and its representation (embedding) in the descriptor space. In practical use, the theoretical optimal solution for minimization in general is not found, because the search is limited to a certain search space. Nonetheless, an estimate of the minimum within the limitations of a practical application (available calculation precision, maximum number of iterations, etc.) is determined.

Thus, descriptors for the vertices are sought by carrying out a minimization process of the sum, over pairs of connected vertices, of distances between the descriptors of the pair of vertices, weighted by the weight of the edge between the pair of vertices, each descriptor being sought for a respective vertex of the vertices.

Each training data image pair includes a training input image of the object and a target image, the target image being produced by projecting the descriptors, visible in the training input image, of the vertices onto the training input image plane according to the position that the object has in the training input image.

The images, together with their associated target images, are used for the supervised training of the machine learning model.

In this way, the machine learning model is trained to recognize unambiguous features of an object (or a plurality of objects). This information can be used for various applications in robot controlling by evaluating the machine learning model in real time, e.g. predicting an object grasping position for assembly. It is to be noted that the supervised training approach enables the explicit coding of symmetry information.

The method of FIG. 6 can be carried out by one or more computers that contain one or more data processing units. The expression "data processing unit" can be understood as referring to any type of entity that enables the processing of data or signals. For example, the data or signals can be processed according to at least one (i.e. one or more than one) specific function that is carried out by the data processing unit. A data processing unit can include an analog circuit, a digital circuit, a mixed-signal circuit, a logic circuit, a microprocessor, a microcontroller, a central processing unit (CPU), a graphics processing unit (GPU), a digital signal processor (DSP), a programmable gate array (FPGA), an integrated circuit, or any combination of these, or can be formed therefrom. Any other way of implementing the respective functions described in more detail in the following can also be understood as a data processing unit or logic circuit system. It will be understood that one or more of the method steps described in detail herein can be carried out (e.g. implemented) via one or more specific functions carried out by the data processing unit.

Different specific embodiments can receive and use sensor signals from different sensors, such as a (e.g. RGB) camera, video, radar, lidar, ultrasound, heat imaging technology, etc., in order for example to obtain sensor data that indicate an object. Specific embodiments can be used to produce training data and for training in machine learning system, e.g. for the autonomous controlling of a robot, e.g. of a robot manipulator, in order to achieve various manipulation tasks in various scenarios. In particular, specific embodiments are applicable in the controlling and monitoring of the carrying out of manipulation tasks, e.g. on assembly lines.

Although particular specific embodiments have been illustrated and described herein, a person of average skill in the art will recognize that many alternatives and/or equivalent implementations may be substituted for the specifically shown and described specific embodiments without departing from the scope of protection of the present invention. The present application is intended to cover all adaptations or variations of the particular specific embodiments discussed herein.

What is claimed is:

1. A method for controlling a robot to pick up an object in various positions, the method comprising the following steps:
determining a plurality of reference points on the object, so that positions of the reference points in three-dimensional space define a pickup pose of the object;
receiving a first camera image of the object in a known position of the object, so that the positions of the reference points in the first camera image are known;
mapping the first camera image onto a first descriptor image using a machine learning model that is trained to assign object points visible in camera images to descriptors, independent of positions of the visible object points in the camera images;
identifying descriptors of the reference points from the first descriptor image by reading out the first descriptor image at the known positions of the reference points;
receiving a second camera image of the object in an unknown position in which the object is to be picked up;
mapping the second camera image onto a second descriptor image using the machine learning model;
searching for the identified descriptors of the reference points in the second descriptor image;
ascertaining the positions of the reference points in the three-dimensional space in the unknown position from found positions of the descriptors of the reference points in the second descriptor image;

ascertaining a pickup pose of the object for the unknown position from the ascertained positions of the reference points in the three-dimensional space; and controlling the robot device to pick up the object corresponding to the ascertained pickup pose.

2. The method as recited in claim 1, wherein the positions of the reference points in the three-dimensional space in the unknown position are ascertained from the found positions of the descriptors of the reference points in the second descriptor image, by projecting depth information for the positions of the reference points in the second camera image, corresponding to the positions of the reference points in the second descriptor image, into the three-dimensional space.

3. The method as recited in claim 1, wherein the reference points include at least two reference points that are defined in such a way that they are situated along an extended segment of the object, and the pickup pose of the object for the unknown position being ascertained by ascertaining an axis that extends through the at least two reference points.

4. The method as recited in claim 1, wherein the reference points include at least three reference points that are defined in such a way that they are situated on a flat surface of the object, and the pickup pose of the object for the unknown position being ascertained by ascertaining a plane that extends through the at least three reference points.

5. The method as recited in claim 1, wherein training of the machine learning model includes:
   obtaining a 3D model of the object, the 3D model including a grid of vertices;
   determining a descriptor for each vertex of the grid;
   producing training data image pairs, each training data image pair including a training input image that indicates the object and a target image, and producing of the target image includes:
      determining the vertex positions of vertices of the object model of the object that the vertices have in the training input image, and
      assigning, for each determined vertex position in the training input image, the descriptor determined for the vertex at the vertex position to the position in the target image; and
   training the machine learning model through supervised learning, using the training data image pairs as training data.

6. The method as recited in claim 5, wherein the producing of the training data image pairs includes obtaining a plurality of images of the object in various positions and producing a training data image pair from each obtained image by producing a respective target image for the obtained image.

7. The method as recited in claim 5, further comprising:
   determining the vertex positions of vertices of the object model of the object that the vertices have in the training input images from the respective positions that the object has in the training input images.

8. The method as recited in claim 5, wherein the vertices of the 3D model are connected by edges, each edge of the edges having a weight that specifies a closeness of two vertices in the object connected by the edge, and the determining of the descriptor for each vertex of the grid takes place through a search of descriptors for the vertices that minimize a sum, over pairs of connected vertices, of distances between the descriptors of the pair of vertices, weighted by the weight of the edge between the pair of vertices.

9. A robot control device configured to control a robot to pick up an object in various positions, the robot control device configured to:
   determine a plurality of reference points on the object, so that positions of the reference points in three-dimensional space define a pickup pose of the object;
   receive a first camera image of the object in a known position of the object, so that the positions of the reference points in the first camera image are known;
   map the first camera image onto a first descriptor image using a machine learning model that is trained to assign object points visible in camera images to descriptors, independent of positions of the visible object points in the camera images;
   identify descriptors of the reference points from the first descriptor image by reading out the first descriptor image at the known positions of the reference points;
   receive a second camera image of the object in an unknown position in which the object is to be picked up;
   map the second camera image onto a second descriptor image using the machine learning model;
   search for the identified descriptors of the reference points in the second descriptor image;
   ascertain the positions of the reference points in three-dimensional space in the unknown position from found positions of the descriptors of the reference points in the second descriptor image;
   ascertain a pickup pose of the object for the unknown position from the ascertained positions of the reference points in the three-dimensional space; and
   control the robot device to pick up the object corresponding to the ascertained pickup pose.

10. A non-transitory computer-readable medium on which is stored a computer program including instructions for controlling a robot to pick up an object in various positions, the instructions, when executed by a processor, causing the processor to perform the following steps:
   determining a plurality of reference points on the object, so that positions of the reference points in three-dimensional space define a pickup pose of the object;
   receiving a first camera image of the object in a known position of the object, so that the positions of the reference points in the first camera image are known;
   mapping the first camera image onto a first descriptor image using a machine learning model that is trained to assign object points visible in camera images to descriptors, independent of positions of the visible object points in the camera images;
   identifying descriptors of the reference points from the first descriptor image by reading out the first descriptor image at the known positions of the reference points;
   receiving a second camera image of the object in an unknown position in which the object is to be picked up;
   mapping the second camera image onto a second descriptor image using the machine learning model;
   searching for the identified descriptors of the reference points in the second descriptor image;
   ascertaining the positions of the reference points in three-dimensional space in the unknown position from found positions of the descriptors of the reference points in the second descriptor image;
   ascertaining a pickup pose of the object for the unknown position from the ascertained positions of the reference points in the three-dimensional space; and controlling the robot device to pick up the object corresponding to the ascertained pickup pose.

* * * * *